(12) United States Patent
Chino et al.

(10) Patent No.: US 6,469,081 B1
(45) Date of Patent: Oct. 22, 2002

(54) STYRENE-BASED RESIN COMPOSITION

(75) Inventors: Shinji Chino, Osaka; Akihiko Okada, Ichihara; Nobuyuki Satoh, Tokyo, all of (JP)

(73) Assignee: Idemitsu Petrochemical Co., Ltd., Tokyo (JP)

( * ) Notice: Subject to any disclaimer, the term of this patent is extended or adjusted under 35 U.S.C. 154(b) by 0 days.

(21) Appl. No.: 09/537,414

(22) Filed: Mar. 29, 2000

Related U.S. Application Data

(62) Division of application No. 09/377,838, filed on Aug. 20, 1999, now Pat. No. 6,096,829, which is a division of application No. 09/059,019, filed on Apr. 13, 1998, now Pat. No. 6,031,049, which is a division of application No. 08/711,271, filed on Sep. 9, 1996, now Pat. No. 5,902,850.

(30) Foreign Application Priority Data

Aug. 9, 1995 (JP) ............................................. 7-230978

(51) Int. Cl.$^7$ ......................... C08L 53/02; C08L 51/06; C08K 3/00; C08K 5/54
(52) U.S. Cl. ...................... 524/261; 524/494; 524/505; 525/70; 525/71; 525/89; 525/92 D; 525/98; 525/99
(58) Field of Search ............................. 525/70, 89, 71, 525/98, 92 D, 99; 524/494, 505, 261

(56) References Cited

U.S. PATENT DOCUMENTS

| | | | |
|---|---|---|---|
| 3,375,228 A | * | 3/1968 | Holoch et al. ............... 525/390 |
| 4,011,200 A | * | 3/1977 | Yonemitsu et al. ........... 528/86 |
| 4,654,405 A | * | 3/1987 | Jalbert et al. ................. 525/391 |
| 4,764,559 A | * | 8/1988 | Yamauchi et al. ......... 525/92 D |
| 4,771,096 A | * | 9/1988 | Bussink et al. ............. 524/508 |
| 4,863,996 A | * | 9/1989 | Nakizimz et al. ........... 525/905 |
| 5,089,353 A | | 2/1992 | Negi et al. |
| 5,109,068 A | | 4/1992 | Yamaski et al. |
| 5,127,158 A | | 7/1992 | Nakano |
| 5,166,238 A | | 11/1992 | Nakano et al. |
| 5,200,454 A | | 4/1993 | Nakano |
| 5,219,940 A | | 6/1993 | Nakano |
| 5,270,353 A | | 12/1993 | Nakano et al. |
| 5,326,813 A | | 7/1994 | Okada et al. |
| 5,346,950 A | | 9/1994 | Negi et al. |
| 5,352,727 A | | 10/1994 | Okada |
| 5,360,350 A | * | 11/1994 | Koblitz et al. ............... 439/276 |
| 5,391,611 A | | 2/1995 | Funayama et al. |
| 5,418,275 A | | 5/1995 | Ikada et al. |
| 5,436,397 A | | 7/1995 | Okada |
| 5,444,126 A | | 8/1995 | Okada et al. |
| 5,543,462 A | | 8/1996 | Okada et al. |
| 5,777,028 A | | 7/1998 | Okada et al. |
| 5,798,172 A | | 8/1998 | Funaki et al. |
| 5,891,951 A | | 4/1999 | Nakano et al. |
| 5,902,850 A | | 5/1999 | Chino et al. |
| 6,005,050 A | * | 12/1999 | Okada et al. ................. 525/98 |
| 6,008,293 A | | 12/1999 | Nakano et al. |
| 6,013,709 A | | 1/2000 | Masuyama et al. |
| 6,013,726 A | | 1/2000 | Nakano et al. |
| 6,031,049 A | | 2/2000 | Chino et al. |
| 6,043,307 A | | 3/2000 | Nakano et al. |
| 6,046,275 A | | 4/2000 | Nakano et al. |
| 6,071,643 A | | 6/2000 | Chino et al. |
| 6,239,217 B1 | * | 5/2001 | Bank et al. .................. 525/98 |

FOREIGN PATENT DOCUMENTS

| | | |
|---|---|---|
| EP | 0 324 398 | 7/1989 |
| EP | 0 639 916 | 2/1995 |
| WO | WO 91/01352 | 7/1991 |

* cited by examiner

*Primary Examiner*—D. R. Wilson
(74) *Attorney, Agent, or Firm*—Oblon, Spivak, McClelland, Maier & Neustadt, P.C.

(57) ABSTRACT

Disclosed is a syndiotactic, polystyrenic resin composition comprising (A) 100 parts by weight of a component composed of (a) from 10 to 98% by weight of a styrene-based polymer having a syndiotactic configuration and (b) from 2 to 90% by weight of a polyolefin, (B) from 0.5 to 50 parts by weight of a styrene-olefin copolymer having a styrene content of from 40 to 85% by weight, and optionally (C) from 0.5 to 10.0 parts by weight, relative to 100 parts by weight of the component (a) of (A), of a polyphenylene ether (having an intrinsic viscosity in chloroform at 25° C. of 0.4 dl/g or higher) and/or (D) from 0 to 200 parts by weight, relative to 100 parts by weight of the component (b) of (A), of a styrene-olefin copolymer having a styrene content of from 5 to 35% by weight and/or (E) from 0 to 200 parts by weight, relative to 100 parts by weight of the component (b) of (A), of at least one selected from paraffinic oils, paraffinic waxes, mineral oils and siloxanic oils. The composition may optionally contain (F), from 0.5 to 350 parts by weight, relative to 100 parts by weight of the resin components, of an inorganic filler and (G) from 0.1 to 10 parts by weight, relative to the same, of a polymer which is miscible with or has an affinity for the component (a) of (A) and which has a polar group. The composition can be formed into articles having good heat resistance, a high modulus of elasticity and good toughness. In addition, the articles are advantageous in that their surface layers are hardly peeled.

10 Claims, No Drawings

STYRENE-BASED RESIN COMPOSITION

This application is a Division of application Ser. No. 09/377,838 filed on Aug. 20, 1999, now U.S. Pat. No. 6,096,829, which is a Divisional of Ser. No. 09/059,019, filed Apr. 13, 1998, now U.S. Pat. No. 6,031,049, which is a Divisional of Ser. No. 08/711,271, filed Sep. 9, 1996, now U.S. Pat. No. 5,902,850.

FIELD OF THE INVENTION

The present invention relates to a syndiotactic, polystyrenic resin composition. More precisely, it relates to a syndiotactic, polystyrenic resin composition which can be formed into an article having improved heat resistance, an increased modulus of elasticity and greatly improved toughness, and in addition, the peeling of the surface layer of the article to be formed from the composition is retarded.

BACKGROUND OF THE INVENTION

Articles formed from a styrene-based polymer having a syndiotactic configuration (hereinafter referred to as SPS) have excellent heat resistance and chemical resistance but have poor impact resistance. Therefore, the polymer has heretofore been used in limited ranges. In order to improve the impact resistance of SPS articles, it has been proposed to add rubber-like elastic substances and other thermoplastic resins to SPS (see Japanese Patent Application Laid-Open Nos. 257950/1987, 146944/1989, 182344/1989, 279944/1989, and 64140/1990).

Concretely, a composition comprising SPS and, as a rubber-like elastic material, a component containing a styrenic compound (see Japanese Patent Application Laid-Open No. 146944/1989), and a composition comprising a mixture of SPS and a thermoplastic resin and/or a rubber-like polymer except SPS, and, as a miscibility-improving agent, a styrenic chain-containing, block or graft copolymer (see Japanese Patent Application Laid-open No. 279944/1989) have been proposed.

These compositions contain, as a miscibility-improving agent, a polystyrenic chain-containing, block or graft polymer, in order to improve the miscibility of a rubber component with immiscible SPS and to improve the dispersibility of the rubber component and the interfacial strength between the constitutive components. However, the effect of the miscibility-improving agent therein is not satisfactory. Therefore, the articles formed from these compositions are not satisfactorily tough and the peeling of the surface layers from the articles could not be retarded sufficiently.

SUMMARY OF THE INVENTION

Given the situations, it is an object of the present invention to provide a syndiotactic, polystyrenic resin composition which can be formed into an article having an increased modulus of elasticity, high heat resistance and greatly improved toughness, and additionally having high impact resistance while retarding the peeling of the surface layer from the article.

We, the inventors of the present invention have assiduously studied so as to develop a syndiotactic, polystyrenic resin composition having the above-mentioned favorable properties and, as a result, have found that the intended object can be attained by a composition comprising a styrene-based polymer having a syndiotactic configuration and a polyolefin and, as a miscibility-improving agent for these, a particular styrene-olefin copolymer, in predetermined ratios. In addition, we have found that, when a small amount of a polyphenylene ether is added to the composition, the toughness of an article to be formed from the resulting composition can be more effectively improved. Moreover, we have further found that, when a particular styrene-based copolymer and/or a particular oil or wax are/is added thereto, the toughness of the article can be much more effectively improved. Furthermore, we have found that, when an inorganic filler, or a combination of an inorganic filler and a particular polymer having a polar group is added to the composition in predetermined ratios, the heat resistance and the modulus of elasticity of the article can be much more increased. On the basis of these findings, we have completed the present invention.

Specifically, the present invention provides;

(1) a syndiotactic, polystyrenic resin composition comprising resin components of (A) 100 parts by weight of a component composed of (a) from 10 to 98% by weight of a styrene-based polymer having a syndiotactic configuration and (b) from 2 to 90% by weight of a polyolefin, and (B) from 0.5 to 50 parts by weight of a styrene-olefin copolymer having a styrene content of from 40 to 85% by weight;

(2) a syndiotactic, polystyrenic resin composition comprising resin components of (A) 100 parts by weight of a component composed of (a) from 10 to 98% by weight of a styrene-based polymer having a syndiotactic configuration and (b) from 2 to 90% by weight of a polyolefin, (B) from 0.5 to 50 parts by weight of a styrene-olefin copolymer having a styrene content of from 40 to 85% by weight, and (C) from 0.5 to 10.0 parts by weight, relative to 100 parts by weight of the component (a) of (A), of a polyphenylene ether (having an intrinsic viscosity in chloroform at 25° C. of 0.4 dl/g or higher);

(3) a syndiotactic, polystyrenic resin composition of the above-mentioned (1) or (2), which further contains (D) from 0 to 200 parts by weight, relative to 100 parts by weight of the component (b) of (A), of a styrene-olefin copolymer having a styrene content of from 5 to 35% by weight;

(4) a syndiotactic, polystyrenic resin composition of the above-mentioned (1) or (2), which further contains (E) from 0 to 200 parts by weight, relative to 100 parts by weight of the component (b) of (A), of a paraffinic oil, a paraffinic wax, a mineral oil and/or a siloxanic oil; and (5) a syndiotactic, polystyrenic resin composition of the above-mentioned (1) or (2), which further contains (D) from 0 to 200 parts by weight, relative to 100 parts by weight of the component (b) of (A), of a styrene-olefin copolymer having a styrene content of from 5 to 35% by weight, and (E) from 0 to 200 parts by weight, relative to 100 parts by weight of the component (b) of (A), of a paraffinic oil, a paraffinic wax, a mineral oil and/or a siloxanic oil.

Preferred embodiments of the present invention are;

(6) the syndiotactic, polystyrenic resin composition of any of the above-mentioned (1) to (5), which further contains (F) from 0.5 to 350 parts by weight, relative to 100 parts by weight of the resin components, of an inorganic filler, and (7) the syndiotactic, polystyrenic resin composition of any of the above-mentioned (1) to (5), which further contains (F) from 0.5 to 350 parts by weight, relative to 100 parts by weight of the resin components, of an inorganic filler, and (G) from 0.1 to 10 parts by weight, relative to the same, of a polymer which is miscible with or has an affinity for the component (a) of (A) and which has a polar group.

DETAILED DESCRIPTION OF THE INVENTION

The resin composition of the present invention comprises, as the component (a) of (A), a styrene-based polymer having a syndiotactic configuration. The syndiotactic configuration in the styrene-based polymer as referred to herein indicates that the stereochemical structure of the polymer is syndiotactic or, that is, such that the phenyl groups or substituted phenyl groups which are in the side chains of the polymer are located alternately in opposite directions relative to the main chain of the polymer that consists of carbon-carbon bonds. The tacticity of the polymer is quantitatively determined through nuclear magnetic resonance thereof using a carbon isotope ($^{13}C$-NMR). The tacticity as determined through $^{13}C$-NMR can be represented by the proportions of the structural units as continuously connected to each other, for example, in terms of diad for two structural units, triad for three structural units and pentad for five structural units. The styrene-based polymer having a syndiotactic configuration as referred to herein includes, for example, polystyrene, poly(alkylstyrene), poly(halogenostyrene), poly(halogenoalkylstyrene), poly(alkoxystyrene), poly (vinyl benzoate), hydrogenated polymers of these, mixtures of these, and copolymers consisting essentially of these, which have generally 75% or more, preferably 85% or more of syndiotacticity of racemic diad, or have generally 30% or more, preferably 50% or more of syndiotactcity of racemic pentad. The poly(alkylstyrene) includes, for example, poly (methylstyrene), poly(ethylstyrene), poly(isopropylstyrene), poly(tert-butylstyrene), poly(phenylstyrene), poly (vinylnaphthalene), and poly(vinylstyrene). The poly (halogenostyrene) includes, for example, poly (chlorostyrene), poly(bromostyrene), and poly (fluorostyrene). The poly(halogenoalkylstyrene) includes, for example, poly(chloromethylstyrene). The poly (alkoxystyrene) includes, for example, poly (methoxystyrene), and poly(ethoxystyrene).

Of these styrene-based polymers, especially preferred are polystyrene, poly(p-methylstyrene), poly(m-methylstyrene), poly(p-tert-butylstyrene), poly(p-chlorostyrene), poly(m-chlorostyrene), poly(p-fluorostyrene), hydrogenated polystyrene, and copolymers comprising structural units of these.

The molecular weight of the styrene-based polymer for use in the present invention is not specifically defined. Preferably, however, the polymer has a weight average molecular weight of 10,000 or more, more preferably 50,000 or more. The molecular weight distribution of the polymers is not also defined. Various polymers having different molecular weights can be applied to the present invention. However, polymers having a weight average molecular weight of less than 10,000 are undesirable, since the thermal and mechanical properties of the composition, if comprising any of such polymers, and those of the articles to be formed from the composition often tend to be poor.

The styrene-based polymer having a syndiotactic configuration for use in the present invention can be obtained, for example, by polymerizing a styrenic monomer (capable of giving any of the above-mentioned styrene-based polymers) in the presence of a catalyst composed of titanium compound and a condensate to be produced from water and a trialkyl aluminium, in an inert hydrocarbon solvent or in the absence of such a solvent (see Japanese Patent Application Laid-Open No. 187708/1987). Poly(halogenoalkylstyrene)s capable of being employed in the present invention can be obtained, for example, according to the method described in Japanese Patent Application Laid- Open No. 46912/89; and hydrogenated polymers for use in the invention can be obtained, for example, according to the method described in Japanese Patent Application Laid-Open No. 178505/89.

The styrene-based polymers having a syndiotactic configuration, which shall constitute the component (a) of (A) in the composition of the present invention, can be used either singly or as combined.

The component (b) of (A) in the composition of the invention is a polyolefin, which may comprise monomer units to be derived from any of olefins and dienes such as ethylene, propylene, butylene, butene, octene, butadiene, isoprene, norbornene, norbornadiene, and cyclopentadiene. It includes any known polyolefins. Specific examples of the polyolefin are ethylene-propylene copolymer rubber (EPM), ethylene-propylene-diene copolymer rubber (EPDM), isotactic polypropylene, syndiotactic polypropylene, atactic polypropylene, block polypropylene, random polypropylene, high-density polyethylene, high-pressure-process, low-density polyethylene, linear, low-density polyethylene, cyclic polyolefins, and copolymers to be obtained from two or more monomers constituting these polymers. Of these, preferred are EPM, EPDM, polypropylene and polyethylene.

The polyolefins that shall constitute the component (b) can be used either singly or as combined.

In the composition of the present invention, the component (A) comprises from 10 to 98% by weight, preferably from 20 to 95% by weight, more preferably from 30 to 90% by weight of the above-mentioned component (a), and from 2 to 90% by weight, preferably from 5 to 80% by weight, more preferably from 10 to 70% by weight of the above-mentioned component (b). If the amount of the component (a) of (A) is less than the above-mentioned range, the composition will lose the characteristics of the syndiotactic polystyrene, and the modulus of elasticity and the heat resistance of the article to be formed from the composition will be noticeably lowered. If, on the other hand, it is more than the range, the toughness of the article could not be satisfactorily improved.

The composition of the present invention comprises from 0.5 to 50 parts by weight, relative to 100 parts by weight of the component (A), of the component (B) which is a styrene-olefin copolymer having a styrene content of from 40 to 85% by weight. The component (B) acts as a miscibility-improving agent for the components (a) and (b) that constitute the component (A). The block copolymer of the component (B) must have a styrene content of from 40 to 85% by weight. Preferably, the copolymer has a melt viscosity of 1200 Pa·sec or less at a temperature of 300° C. and at a shearing rate of 100 $sec^{-1}$.

If the styrene content of the copolymer is outside the defined range, the copolymer of the component (B) could not sufficiently function as a miscibility-improving agent for the components (a) and (b). If so, the toughness of the article to be formed from the composition is low, the peeling of the surface layer from the article could not be satisfactorily retarded, and therefore the objects of the present invention could not be attained satisfactorily. In view of its miscibility-improving function, the styrene content of the copolymer of the component (B) is preferably from 45 to 80% by weight, more preferably from 50 to 75% by weight. If, on the other hand, the melt viscosity of the copolymer (this is a parameter of the molecular weight of the copolymer) is more than 1200 Pa·sec, the copolymer could not sufficiently function as a miscibility-improving agent for the components (a) and (b) and, as a result, the objects of the present invention could not be attained.

The styrene-olefin copolymer of the component (B) includes, for example, styrene-butadiene random copolymer, hydrogenated styrene-butadiene random copolymer, styrene-isoprene random copolymer, hydrogenated styrene-isoprene random copolymer, styrene-butadiene block copolymer (SBR), hydrogenated styrene-butadiene block copolymer (SEB, SEBC), styrene-butadiene-styrene block copolymer (SBS), hydrogenated styrene-butadiene-styrene block copolymer (SEBS), styrene-isoprene block copolymer (SIR), hydrogenated styrene-isoprene block copolymer (SEP), styrene-isoprene-styrene block copolymer (SIS), hydrogenated styrene-isoprene-styrene block copolymer (SEPS), styrene-ethylene copolymer, styrene-propylene copolymer, ethylene-styrene graft copolymer, propylene-styrene graft copolymer, EPM-styrene graft copolymer, EPDM-styrene graft copolymer, and their modificates. Of these, preferred are styrene-olefin diblock copolymers and styrene-olefin triblock copolymers, which include, for example, styrene-butadiene block copolymer (SEB, SEBC), styrene-butadiene-styrene block copolymer (SBS), hydrogenated styrene-butadiene-styrene block copolymer (SEBS), styrene-isoprene block copolymer (SIR), hydrogenated styrene-isoprene block copolymer (SEP), styrene-isoprene-styrene block copolymer (SIS), hydrogenated styrene-isoprene-styrene block copolymer (SEPS) and their modificates.

The olefin moiety of the component (B) is preferably compatible with the component (b) of (A). The component (B) may comprise one or more such styrene-olefin copolymers.

The composition of the present invention shall comprise from 0.5 to 50 parts by weight, relative to 100 parts by weight of the component (A), of the component (B). If the content of the component (B) is less than 0.5 parts by weight, the miscibility-improving effect of the component (B) is insufficient. If so, therefore, the toughness of the article to be formed from the composition could not be improved satisfactorily and the peeling of the surface layer from the article could not be sufficiently retarded. However, even if the content is more than 50 parts by weight, any more improvement in the toughness of the article and in the retardation of the peeling of the surface layer from the article could not be expected. Therefore, if too much amount of the component (B) over the defined range is added to the composition of the invention, such is unfavorable since the cost of the composition is increased. In view of the toughness and other properties of the article to be formed from the composition and of the intended object of retarding the peeling of the surface layer from the article, the content of the component (B) is preferably from 1 to 40 parts by weight, more preferably from 3 to 30 parts by weight.

If desired, the resin composition of the present invention may optionally contain, as the third component (C), a polyphenylene ether. Polyphenylene ethers are known, for which, for example, referred to are U.S. Pat. Nos. 3,306,874, 3,306,875, 3,257,357 and 3,257,358. Concretely, homopolymers or copolymers of polyphenylene ethers for use in the present invention can be produced from one or more phenolic compounds as substituted at two or three positions thereof, through oxidative coupling in the presence of a copper-amine complex. The copper-amine complex to be used may be derived from primary, secondary and tertiary amines. Suitable examples of polyphenylene ethers for use in the present invention include poly(2,3-dimethyl-6-ethyl-1,4-phenylene ether); poly(2-methyl-6-chloromethyl-1,4-phenylene ether); poly(2-methyl-6-hydroxyethyl-1,4-phenylene ether); poly(2-methyl-6-n-butyl-1,4-phenylene ether); poly(2-ethyl-6-isopropyl-1,4-phenylene ether); poly(2-ethyl-6-n-propyl-1,4-phenylene ether); poly(2,3,6-trimethyl-1,4-phenylene ether); poly[2-(4'-methylphenyl)-1,4-phenylene ether]; poly(2-bromo-6-phenyl-1,4-phenylene ether); poly(2-methyl-6-phenyl-1,4-phenylene ether); poly(2-phenyl-1,4-phenylene ether); poly(2-chloro-1,4-phenylene ether); poly(2-methyl-1,4-phenylene ether); poly(2-chloro-6-ethyl-1,4-phenylene ether); poly(2-chloro-6-bromo-1,4-phenylene ether); poly(2,6-di-n-propyl-1,4-phenylene ether); poly(2-methyl-6-isopropyl-1,4-phenylene ether); poly(2-chloro-6-methyl-1,4-phenylene ether); poly(2-methyl-6-ethyl-1,4-phenylene ether); poly(2,6-dibromo-1,4-phenylene ether); poly(2,6-dichloro-1,4-phenylene ether); poly(2,6-diethyl-1,4-phenylene ether); and poly(2,6-dimethyl-1,4-phenylene ether). In addition to these homopolymers, also employable are copolymers to be derived from two or more phenolic compounds such as those to be used in producing the homopolymers. Moreover, also employable are graft copolymers and block copolymers composed of aromatic vinyl compounds such as polystyrene, and polyphenylene ethers such as those mentioned above. Of those, especially preferred is poly(2,6-dimethyl-1,4-phenylene ether).

In view of its effect of improving the impact resistance of the article to be formed from the composition of the invention, it is desirable that the polyphenylene ether of the component (C) has an intrinsic viscosity of 0.4 dl/g or more, preferably 0.5 dl/g or more, as measured in chloroform at 25° C. The content of the component (C) in the composition of the invention shall be from 0.5 to 10 parts by weight, relative to 100 parts by weight of the component (a) of (A). If the content is less than 0.5 parts by weight, the impact strength of the article to be formed from the composition could not be improved satisfactorily. However, if it is more than 10 parts by weight, the shapability or moldability of the composition will be worsened. Preferably, the content of the component (C) is from 1.0 to 5.0 parts by weight relative to 100 parts by weight of the component (a) of (A).

In order to further improve the toughness of the article to be formed from the resin composition of the invention, the composition may contain, if desired, a fourth component (D) of a styrene-olefin copolymer having a styrene content of from 5 to 35% by weight. The component (D) must be a styrene-olefin copolymer having high miscibility with or a strong affinity for the component (b) of (A). Therefore, the styrene content of the copolymer must be from 5 to 35% by weight. If its styrene content does not fall within the defined range, the copolymer would not be effective in improving the toughness of the article to be formed from the composition of the invention.

The styrene-olefin copolymer for the component (D) differs from that for the component (B) only in the styrene content. Therefore, for the copolymers for the component (D), those for the component (B) shall be referred to except for the styrene content. Of these, preferred for the component (D) are styrene-olefin diblock copolymers and styrene-olefin triblock copolymers. Concretely, preferred examples of the copolymers for the component (D) include styrene-butadiene block copolymer (SBR), hydrogenated styrene-butadiene block copolymer (SEB, SEBC), styrene-butadiene-styrene block copolymer (SBS), hydrogenated styrene-butadiene-styrene block copolymer (SEBS), styrene-isoprene block copolymer (SIR), hydrogenated styrene-isoprene block copolymer (SEP), styrene-isoprene-styrene block copolymer (SIS), hydrogenated styrene-isoprene-styrene block copolymer (SEPS), and their modificates.

The component (D) may comprise one or more such copolymers, either singly or as combined.

The composition of the present invention may comprise from 0 to 200 parts by weight, relative to 100 parts by weight of the component (b) of (A), of the component (D). Even if the content of the component (D) is more than 200 parts by weight, the toughness of the article to be formed from the composition could not be improved so much. Therefore, the addition of such a large amount of the component (D) to the composition is unfavorable in view of the cost of the composition. Preferably, the content of the component (D) in the composition is from 1 to 150 parts by weight, more preferably from 5 to 150 parts by weight.

In order to improve the fluidity of the resin composition of the invention and the toughness of the article to be formed from the composition, still another component (E) of a paraffinic oil, a paraffinic wax, a mineral oil or a siloxanic oil may be added to the composition, if desired. The component (E) must be highly miscible with or have a strong affinity for the component (b) of (A). If not, the toughness of the article to be formed from the composition of the invention could not be improved.

The component (E) of a paraffinic oil, a paraffinic wax, a mineral oil or a siloxanic oil includes, for example, polyethylenic oligomers, polyethylenic waxes, polyolefinic oligomers, polyolefinic waxes, heavy cycloparaffins, mineral oils, fatty acid esters, esters of aliphatic, dibasic acids, phthalates, aromatic carboxylates, phosphates, polydimethylsiloxanes, dimethylsiloxane-diphenylsiloxane copolymers, and polymethylphenylsiloxanes. Of these, preferred are polyethylenic oligomers, polyethylenic waxes, mineral oils, polydimethylsiloxanes, dimethylsiloxane-diphenylsiloxane copolymers, and polymethylphenylsiloxanes.

The component (E) may comprise one or more such compounds, either singly or as combined.

The composition of the present invention may comprise from 0 to 200 parts by weight, relative to 100 parts by weight of the component (b) of (A), of the component (E). Even if the content of the component (E) is more than 200 parts by weight, any further effect of the component (E) of improving the toughness of the article to be formed from the composition could not be expected, but rather the modulus of elasticity of the article would be unfavorably lowered. Preferably, the content of the component (E) is from 1 to 150 parts by weight, more preferably from 5 to 100 parts by weight.

If desired, the composition of the present invention may comprise both the component (D) and the component (E). The combination of the component (D) and the component (E) is preferred to the single use of either the component (D) or the component (E), since the former produces higher improvement in the toughness of the article to be formed from the composition of the invention. If desired, the component (D) and/or the component (E) may be previously mixed with the component (b) of (A).

In order to much more increase the modulus of elasticity and the heat resistance of the article to be formed from the resin composition of the invention, it is advantageous to incorporate still another component (F) of an inorganic filler into the composition. Various forms of inorganic fillers can be employed herein, including, for example, fibrous, granular and powdery ones. Fibrous fillers include, for example, glass fibers, carbon fibers and whiskers. The form or shape of the fibrous filler includes, for example, clothes, mats, bound and cut fibers, short fibers, filaments and whiskers. The bound and cut fibers preferably have a length of from 0.05 to 5 mm and a diameter of from 5 to 20 $\mu$m.

Examples of granular or powdery fillers include talc, carbon black, graphite, titanium dioxide, silica, mica, calcium carbonate, calcium sulfate, barium carbonate, magnesium carbonate, magnesium sulfate, barium sulfate, hydroxysulfates, tin hydroxide, alumina, kaolin, silicon carbide, metal powders, glass powder, glass flakes, and glass beads. Of these, preferred are glass fillers, such as glass powder, glass flakes, glass beads, glass filaments, glass fibers, glass rovings, and glass mats.

It is desirable that the inorganic filler is surface-treated. For the surface treatment, used is a coupling agent, by which the adhesiveness of the filler to resins is improved. The coupling agent can be selected from any known silane coupling agents, titanium coupling agents and others. Above all, especially preferably used are aminosilanes and epoxysilanes such as $\gamma$-aminooropyltrimethoxysilane, N-$\beta$-(aminoethyl)-$\gamma$-aminopropyltrimethoxysilane, $\gamma$-glycidoxypropyltrimethoxysilane, and $\beta$-(3,4-epoxycyclohexyl)ethyltrimethoxysilane; and also isopropyl tri(N-amidoethyl, aminoethyl)titanate.

The means of surface-treating the filler with any of such coupling agents is not specifically defined, and any known methods can be employed for the surface treatment. For example, employable are a sizing method where a solution or suspension of a coupling agent is applied to a filler as a so-called sizing agent, and also a dry-mixing method, a spraying method, an integral-blending method and a dry-concentrating method where a Henschel mixer, a super mixer, a V-shaped mixer or the like is used. Any of these methods may be selected, depending on the shape of the filler to be surface-treated. Of these, preferably employed are a sizing method, a dry-mixing method and a spraying method.

The coupling agent can be combined with a film-forming substance for glass. The film-forming substance to be combined is not specifically defined but includes, for example, polyester-type, polyether-type, urethane-type, epoxy-type, acryl-type and vinyl acetate-type polymers.

One or more inorganic fillers can be used for the component (F), either singly or as combined. The content of the component (F) to be in the composition of the present invention shall be from 0.5 to 350 parts by weight relative to 100 parts by weight of ① the resin component comprising the component (A) and the component (B), ② the resin component comprising the component (A), the component (B) and the component (C), ③ the resin component comprising the component (A), the component (B), the component (C) and the component (D), ④ the resin component comprising the component (A), ⑤ the component (B), the component (C) and the component (E), the resin component comprising the component (A), the component (B), the component (C), the component (D) and the component (E), ⑥ the resin component comprising the component (A), the component (B) and the component (D), ⑦ the resin component comprising the component (A), the component (B) and the component (E), or ⑧ the resin component comprising the component (A), the component (B), the component (D) and the component (E). If the content is less than 0.5 parts by weight, the effect of the filler could not be attained. However, if it is more than 350 parts by weight, the dispersibility of the filler in the composition is worsened so that the composition is disadvantageously difficult to shape or mold. Preferably, the content of the inorganic filler is from 5 to 200 parts by weight, more preferably from 10 to 150 parts by weight.

In order to improve the adhesiveness of the inorganic filler to the resin components constituting the composition of the present invention, it is desirable to add, along with the inorganic filler for the component (F), still another component (G) of a polymer which is miscible with or has an affinity for the styrene-based polymer having a syndiotactic configuration for the component (a) of (A) and which has a polar group, to the composition.

The polymer which is miscible with or has an affinity for the component (a) of (A), as referred to herein, is a polymer having therein a polymeric chain that is miscible with or has an affinity for the component (a) of (A). The polymer of this type includes, for example, polymers having, in the main chain, the block chain or the graft chain, any of syndiotactic polystyrene, atactic polystyrene, isotactic polystyrene, styrenic copolymer, polyphenylene ether, polyvinyl methyl ether and the like. The polar group which the polymer shall have is not specifically defined, and may be any and every group capable of improving the adhesiveness of the inorganic filler for the component (F) to the resin components constituting the composition of the invention. Examples of the polar group include residues of acid anhydrides, carboxylic acids, carboxylates, carboxylic acid chlorides, carboxylic acid amides, salts of carboxylic acids, sulfonic acids, sulfonates, sulfonic acid chlorides, sulfonic acid amides, or salts of sulfonic acids; and also epoxy groups, amino groups, imido groups and oxazoline groups.

Specific examples of the component (G) include styrene-maleic anhydride copolymer (SMA), styrene-glycidyl methacrylate copolymer, terminal carboxylic acid-modified polystyrene, terminal epoxy-modified polystyrene, terminal oxazoline-modified polystyrene, terminal amino-modified polystyrene, sulfonated polystyrene, styrene-based ionomer, styrene-methyl methacrylate graft polymer, (styrene-glycidyl methacrylate)-methyl methacrylate graft polymer, acid-modified acryl-styrene graft polymer, (styrene-glycidyl methacrylate)-styrene graft polymer, polybutylene terephthalate-polystyrene graft polymer; as well as modified, styrene-based polymers such as maleic anhydride-modified syndiotactic polystyrene, fumaric acid-modified syndiotactic polystyrene, glycidyl methacrylate-modified syndiotactic polystyrene, and amine-modified syndiotactic polystyrene; and also modified polyphenylene ether-based polymers such as (styrene-maleic anhydride)-polyphenylene ether graft polymer, maleic anhydride-modified polyphenylene ether, fumaric acid-modified polyphenylene ether, glycidyl methacrylate-modified polyphenylene ether, and amine-modified polyphenylene ether. Of these, especially preferred are modified syndiotactic polystyrenes and modified polyphenylene ethers. These can be used either singly or as combined.

The polar group content of the polymer is preferably from 0.01 to 20% by weight, more preferably from 0.05 to 10% by weight. If the content is less than 0.01% by weight, a large amount of the polymer for the component (G) must be added to the composition in order to attain the intended adhesiveness of the inorganic filler to the resin components constituting the composition. Such is unfavorable, since the mechanical properties, the heat resistance and the shapability of the composition are often lowered. If, on the other hand, the content is more than 20% by weight, the miscibility of the polymer with the component (a) of (A) would be lowered and such is also unfavorable.

Modified syndiotactic polystyrenes are preferably used for the component (G), which are referred to below. SPS to be modified is not specifically defined. Any of the polymers as referred to for the component (a) of (A) can be used to obtain modified polymers. In view of the miscibility of the modified polymers with the component (a) of (A), preferably used are styrene homopolymers or styrene-substituted styrene copolymers. For the latter copolymers, the compositional proportions of the constitutive monomers are not specifically defined. However, the content of the substituted styrene units in the copolymers is preferably 50 mol % or less. If it is more than 50 mol %, the miscibility of the modified copolymers with the component (a) of (A) would be lowered and such is unfavorable. The substituted styrene includes, for example, alkylstyrenes such as methylstyrene, ethylstyrene, isopropylstyrene, tert-butylstyrene, and vinylstyrene; halogenostyrenes such as chlorostyrene, bromostyrene, and fluorostyrene; halogenoalkylstyrenes such as chloromethylstyrene; and alkoxystyrenes such as methoxystyrene, and ethoxystyrene. These substituted styrenes can be used either singly or as combined.

As the modifying agent to be used for modifying SPS such as that mentioned hereinabove, employable is a compound having both an ethylenic double bond and a polar group in one molecule. The compound includes, for example, maleic acids such as maleic anhydride, maleic acid, maleates, maleimide and its N-substituted derivatives, and salts of maleic acid; fumaric acids such as fumaric acid, fumarates, and salts of fumaric acid; itaconic acids such as itaconic anhydride, itaconic acid, itaconates, and salts of itaconic acid; acrylic acids such as acrylic acid, acrylates, acrylic acid amides, and salts of acrylic acid; and methacrylic acids such as methacrylic acid, methacrylates, methacrylic acid amides, salts of methacrylic acid, and glycidyl methacrylate. Of these, especially preferred are maleic anhydride, fumaric acid, fumarates and glycidyl methacrylate. The modifying agent can comprise one or more such compounds either singly or as combined.

To obtain modified SPS, for example, SPS such as that mentioned above is reacted with a modifying agent such as that mentioned above, in the presence or absence of a solvent or any other resin. The modification is not specifically defined but can be conducted in accordance with any known methods. For example, employable are a method of melting, kneading and reacting the components at a temperature falling between 150° C. and 350° C., using, for example, a roll mill, a Bambury mixer or an extruder, and a method of reacting the components under heat in a solvent such as benzene, toluene or xylene. In order to promote the reaction, it is effective to add to the reaction system, a radical-generating agent such as benzoyl peroxide, di-t-butyl peroxide, dicumyl peroxide, t-butyl peroxybenzoate, azobisisobutyronitrile, azobisisovaleronitrile, or 2,3-diphenyl-2,3-dimethylbutane. One preferred method for the modification is to melt and knead the component in the presence of such a radical-generating agent. During the modification, if desired, any other resin can be added to the reaction system.

Of the modified SPS thus obtained, especially preferred are maleic anhydride-modified SPS, fumaric acid-modified SPS and fumarate-modified SPS.

Modified polyphenylene ethers are also preferably used for the component (G), which can be obtained by modifying known polyphenylene ethers with a modifying agent. The polyphenylene ethers to be modified are not specifically defined, and any of the polymers as referred to hereinabove for the component (C) can be used. Above all, preferred is poly(2,6-dimethyl-1,4-phenylene ether).

The modifying agents usable for the modification of polyphenylene ethers may be the same as those referred to hereinabove for the modification of SPS. In particular, preferably used are maleic anhydride, fumaric acid, fumarates and glycidyl methacrylate. One or more such modifying agents can be used either singly or as combined. The modification of polyphenylene ethers can be conducted in the same manner as that mentioned hereinabove for the modification of SPS.

Of the modified polyphenylene ethers thus obtained, especially preferred are maleic anhydride-modified polyphenylene ether, fumaric acid-modified polyphenylene ether, and fumarate-modified polyphenylene ether.

The composition of the present invention may comprise one or more polymers having a polar group for the component (G), either singly or as combined. The content of the component (G) to be in the composition shall be from 0.1 to 10 parts by weight relative to 100 parts by weight of ① the resin component comprising the component (A) and the component (B), ② the resin component comprising the component (A), the component (B) and the component (C), ③ the resin component comprising the component (A), the component (B), the component (C) and the component (D), ④ the resin component comprising the component (A), the component (B), the component (C) and the component (E), ⑤ the resin component comprising the component (A), the component (B), the component (C), the component (D) and the component (E), ⑥ the resin component comprising the component (A), the component (B) and the component (D), ⑦ the resin component comprising the component (A), the component (B) and the component (E), or ⑧ the resin component comprising the component (A), the component (B), the component (D) and the component (E). If the content is less than 0.1 parts by weight, the adhesiveness of the inorganic filler to the resin components could not be satisfactorily improved. However, if it is more than 10 parts by weight, the heat resistance and the shapability of the composition would be lowered. In view of the adhesiveness of the inorganic filler to the resin components and of the heat resistance and the shapability of the composition, the content of the component (G) in the composition is preferably from 0.5 to 8 parts by weight, more preferably from 1 to 5 parts by weight.

The resin composition of the present invention may optionally contain, if desired, any known additives, such as a nucleating agent, an antioxidant, a plasticizer, a flame retardant, a flame retardant aid, a release agent, a pigment, carbon black, an antistatic agent, and other rubber components and thermoplastic resins, provided that such additives do not detract from the objects of the present invention.

The nucleating agent includes, for example, metal salts of carboxylic acids, such as aluminium di(p-tert-butylbenzoate); metal salts of phosphoric acid such as sodium methylenebis(2,4-di-t-butylphenol) acid phosphate; and also talc and phthalocyanine derivatives. The antioxidant can be selected from any known phosphorus-containing, phenolic, or sulfur-containing antioxidants. The plasticizer can be selected from any known ones, including, for example, polyethylene glycol, polyamide oligomers, ethylenebis-stearoamide, and polyethylene oligomers.

The flame retardant can be selected from any known ones, including, for example, brominated polymers such as brominated polystyrenes, brominated syndiotactic polystyrenes, and brominated polyphenylene ethers; and brominated aromatic compounds such as brominated diphenylalkanes, and brominated diphenyl ethers. The flame retardant aid can be selected from any known ones, including, for example, antimony compounds such as antimony trioxide. The release agent can be selected from any known ones, including, for example, polyethylene waxes, silicone oils, long-chain carboxylic acids, and metal salts of long-chain carboxylic acids. One or more such additives can be used either singly or as combined.

Specific examples of rubber-like elastic materials which can be added to the composition of the present invention include natural rubber, polybutadiene, polyisoprene, polyisobutylene, neoprene, polysulfide rubber, Thiokol rubber, acrylic rubber, urethane rubber, silicone rubber, epichlorohydrin rubber, and also core/shell type, granular, elastic rubber substances, such as butadiene-acrylonitrile-styrene core/shell rubber (ABS), methyl methacrylate-butadiene-styrene core/shell rubber (MBS), methyl methacrylate-butyl acrylate-styrene core/shell rubber (MAS), octyl acrylate-butadiene-styrene core/shell rubber (MABS), alkyl acrylate-butadiene-acrylonitrile-styrene core/shell rubber (AABS), butadiene-styrene core/shell rubber (SBR), methyl methacrylate-butyl acrylate-siloxane and other siloxane-containing core/shell rubbers, as well as modificates to be obtained by modifying these rubbers. One or more such rubber-like elastic materials can be used either singly or as combined.

Any known thermoplastic resins, for example, as selected from polystyrene resins such as polystyrene, HIPS, ABS, and AS; polyester resins such as polycarbonates, polyarylates, polyethylene terephthalate, and polybutylene terephthalate; polyamide resins such as polyamide 6, polyamide 66, polyamide 46, polyamide 12, and aromatic polyamides; and PPS, can be added to the composition of the present invention. One or more such thermoplastic resins can be used either singly or as combined.

The method for preparing the resin composition of the present invention is not specifically defined. The composition can be prepared by any known methods. For example, the components (a) and (b) of (A), the component (B) and optionally the component (C), the component (D), the component (E), the component (F), the component (G) and other various additives are melted and kneaded, using a ribbon blender, a Henschel mixer, a Bambury mixer, a drum tumbler, a single-screw extruder, a twin-screw extruder, a co-kneader, a multi-screw extruder or the like mixing device, to obtain a resin composition of the present invention.

The resin composition of the present invention can be shaped into articles having excellent physical properties, and the method for shaping it is not defined. For example, the composition can be shaped into various articles through injection molding, into sheets or films through extrusion molding, into containers or trays through extrusion molding combined with thermal molding, into monoaxially or biaxially stretched films or sheets through extrusion molding combined with stretching, or into fibrous articles through spinning.

The present invention is described in more detail hereinunder with reference to the following examples, which, however, are not intended to restrict the scope of the invention. The physical properties of the samples as obtained in the following examples were determined according to the methods mentioned below.

(1) Izod impact strength (with notch):
   This was obtained in accordance with JIS K-7110.
(2) Tensile elongation:
   This was obtained in accordance with JIS K-7113.
(3) Surface layer peeling resistance:
   Each sample was visually observed and ranked in three, as follows:
   A: Very good
   B: Good
   C: Not good

PRODUCTION EXAMPLE 1

Production of SPS 1.0 liter of pure styrene and 1 mmol of triethyl aluminium were put into a 2-liter reactor and heated at 80° C. Next, 16.5 ml of a pre-mixed catalyst (comprising 90 μmols of pentamethylcyclopentadienyl titanium trimethoxide, 90 μmols of dimethylanilinium tetrakis(pentafluorophenyl)borate, 29.1 mmols of toluene and 1.8 mmols of triisobutyl aluminium) was added thereto, and the monomer was polymerized at 80° C. for 5 hours. After the polymerization, the product was washed plural times with methanol and dried. Thus was obtained 380 g of a polymer.

The weight average molecular weight of the polymer was measured through gel permeation chromatography at 130° C. using a solvent of 1,2,4-trichlorobenzene, to be 300,000. The ratio of weight average molecular weight/number average molecular weight of the polymer was 2.70. It was confirmed that the polymer obtained herein is SPS from the results of the measurement of its melting point and the $^{13}C$-NMR analysis thereof.

PRODUCTION EXAMPLE 2

Production of Maleic Anhydride-Modified SPS

One kg of SPS as produced in Production Example 1, 30 g of maleic anhydride and 10 g of a radical-generating agent of cumene hydroxyperoxide were dry-blended, then melted and kneaded through a 30-mm twin-screw extruder at a screw revolution of 200 rpm and at a temperature of 300° C. The strands thus extruded out were cooled and then pelletized to obtain pellets of a maleic anhydride-modified SPS.

To measure the degree of modification of the product, one g of the modified SPS was dissolved in ethylbenzene, then re-precipitated in methanol and collected. The thus-collected polymer was subjected to Soxhlet extraction using methanol and then dried. The degree of modification of the polymer was obtained from the intensity of the carbonyl absorption in its IR spectrum and from its titration, to be 1.04% by weight.

PRODUCTION EXAMPLE 3

Production of Fumaric Acid-Modified Polyphenylene Ether

One kg of polyphenylene ether (having an intrinsic viscosity of 0.45 dl/g in chloroform at 25° C.), 30 g of fumaric acid and 20 g of a radical-generating agent of 2,3-dimethyl-2,3-diphenylbutane (produced by Nippon Oils & Fats Co., Ltd. under the trade name of "Nofmer BC") were dry-blended, then melted and extruded through a 30-mm twin-screw extruder at a screw revolution of 200 rpm and at a temperature of 300° C. The temperature of the resin being extruded was about 330° C. The strands thus extruded out were cooled and then pelletized to obtain pellets of a fumaric acid-modified polyphenylene ether. To measure the degree of modification of the product, one g of the modified polyphenylene ether was dissolved in ethylbenzene, then re-precipitated in methanol and collected. The thus-collected polymer was subjected to Soxhlet extraction using methanol and then dried. The degree of modification of the polymer was obtained from the intensity of the carbonyl absorption in its IR spectrum and from its titration, to be 1.6% by weight.

EXAMPLE 1

50 parts by weight of the syndiotactic polystyrene as prepared in Production Example 1 (having a weight average molecular weight of 300,000 and a ratio of weight average molecular weight/number average molecular weight of 2.70) (this corresponds to the component (a) of (A)), 50 parts by weight of EPM (produced by Japan Synthetic Rubber Co., Ltd. under the trade name of "EP-07P") (this corresponds to the component (b) of (A)), and, relative to 100 parts by weight of the sum of these two, 30 parts by weight of SEBS (produced by Asahi Chemical Industry Co., Ltd. under the trade name of "Tuftec H-1081") (this corresponds to the component (B)), 0.5 parts by weight of a nucleating agent of sodium methylenebis(2,4-di-t-butylphenol) acid phosphate (produced by Asahi Denka Co., Ltd. under the trade name of "NA-11"), 0.1 parts by weight of an antioxidant of (2,6-di-t-butyl-4-methylphenyl)pentaerythritol diphosphite (produced by Asahi Denka Co., Ltd. under the trade name of "PEP-36"), and 0.1 parts by weight of tetrakis(methylene-3-(3',5'-di-t-butyl-4'-hydroxyphenyl)) propionate (produced by Adeka Argus Co., Ltd. under the trade name of "MARK AO 60") were dry-blended in a Henschel mixer, then melted, kneaded and pelletized through a twin-screw extruder. The pellets thus obtained were molded through injection molding to obtain test pieces for an Izod impact test and a tensile elongation test. These test pieces were tested to measure their Izod impact strength and tensile elongation. The results obtained are shown in Table 1 below.

EXAMPLES 2 to 43, COMPARATIVE EXAMPLES 1 TO 30

The same process as in Example 1 was repeated except that the components (a) of (A), (b) of (A), (B), (C), (D) and (E) as shown in Table 1 below were used herein. The results obtained are shown in Table 1.

As is known from Table 1, the samples comprising the component (B) having a higher styrene content had much more increased impact strength and elongation than those comprising the component (B) having a lower styrene content. It is also known therefrom that the samples containing the component (C), the component (D) and the component (E) had more increased impact strength and elongation than those not containing them.

EXAMPLE 44

50 parts by weight of the syndiotactic polystyrene as prepared in Production Example 1 (having a weight average molecular weight of 300,000 and a ratio of weight average molecular weight/number average molecular weight of 2.70) (this corresponds to the component (a) of (A)), 50 parts by weight of EPM (produced by Japan Synthetic Rubber Co., Ltd. under the trade name of "EP-07P") (this corresponds to the component (b) of (A)), and, relative to 100 parts by weight of the sum of these two, 30 parts by weight of SEBS (produced by Asahi Chemical Industry Co., Ltd. under the trade name of "Tuftec H-1081") (this corresponds to the component (B)), 0.5 parts by weight of a nucleating agent of sodium methylenebis(2,4-di-t-butylphenol) acid phosphate (produced by Asahi Denka Co., Ltd. under the trade name of "NA-11"), 0.1 parts by weight of an antioxidant of (2,6-di-t-butyl-4-methylphenyl)pentaerythritol diphosphite (produced by Asahi Denka Co., Ltd. under the trade name of "PEP-36"), and 0.1 parts by weight of tetrakis(methylene-3-(3',5'-di-t-butyl-4'-hydroxyphenyl)) propionate (produced by Adeka Argus Co., Ltd. under the trade name of "MARK AO 60") were dry-blended in a Henschel mixer, then melted, kneaded and pelletized through a twin-screw extruder while adding thereto 55.7 parts by weight of glass fibers (produced by Asahi Fiber Glass Co., Ltd. under the trade name of "FT-712"—10 $\mu$m/3 mm) (this corresponds to the component (F)).

The pellets thus obtained were molded through injection molding to obtain test pieces for an Izod impact test and a tensile elongation test. These test pieces were tested to measure their Izod impact strength and tensile elongation. The results obtained are shown in Table 2 below.

EXAMPLES 45 TO 96, COMPARATIVE EXAMPLES 3 TO 70

The same process as in Example 44 was repeated except that the components (a) of (A), (b) of (A), (B), (C), (D), (E), (F) and (G) as shown in Table 2 below were used herein. The results obtained are shown in Table 2.

As is known from Table 2 where all the samples tested contained the inorganic filler of the component (F), the samples comprising the component (B) having a higher styrene content had much more increased impact strength and elongation than those comprising the component (B) having a lower styrene content. It is also known therefrom that the samples containing the component (C), the component (D), the component (E) and the component (G) had more increased impact strength and elongation than those not containing them.

As has been described hereinabove, the impact-resistant, polystyrenic resin composition of the present invention has good shapability and can be formed into articles having high heat resistance, high impact strength, high tensile elongation, and a high modulus of elasticity. Without being limited by the means of shaping it, the composition of the present invention can be shaped into articles having such good physical properties. For example, the impact-resistant, polystyrenic resin composition of the present invention can be molded into various articles through injection molding, into sheets and films through extrusion molding, into containers or trays through extrusion molding combined with thermal molding, into monoaxially or biaxially stretched films or sheets through extrusion molding combined with stretching, or into fibrous articles through spinning.

TABLE 1-1

| | Composition | | | | | | | |
|---|---|---|---|---|---|---|---|---|
| | (a) of A SPS Product Obtained in | (b) of A Polyolefin | | | B Miscibility-Improving Agent | | | |
| Example and Comparative Example | Production Example 1 wt. pts. | Compound | Grade | Amount Added wt. pts. | Compound | Grade | Styrene Content wt. % | Amount Added wt. pts. |
| Example 1 | 50 | EPM | EP07P | 50 | SEBS | H1081 | 60 | 30 |
| Example 2 | 80 | EPM | EP07P | 20 | SEBS | H1081 | 60 | 20 |
| Example 3 | 80 | EPM | EP07P | 20 | SEBS | H1081 | 60 | 10 |
| Example 4 | 80 | EPM | EP07P | 20 | SEBS | H1081 | 60 | 5 |
| Example 5 | 80 | EPM | EP07P | 20 | SEBS | H1081 | 60 | 5 |
| Example 6 | 82 | EPM | EP07P | 18 | SEBS | H1081 | 60 | 5 |
| Example 7 | 89 | EPM | EP07P | 11 | SEBS | H1081 | 60 | 5 |
| Example 8 | 82 | EPM | EP07P | 18 | SEBS | H1081 | 60 | 5 |
| Example 9 | 89 | EPM | EP07P | 11 | SEBS | H1081 | 60 | 5 |
| Example 10 | 82 | EPM | EP07P | 18 | SEBS | H1081 | 60 | 5 |
| Example 11 | 89 | EPM | EP07P | 11 | SEBS | H1081 | 60 | 5 |
| Example 12 | 83 | EPM | EP07P | 17 | SEBS | H1081 | 60 | 5 |
| Example 13 | 83 | EPM | EP01P | 17 | SEBS | H1081 | 60 | 5 |
| Example 14 | 80 | EPM | EP07P | 20 | SEPS | Septon 2104 | 65 | 5 |
| Example 15 | 80 | EPM | EP07P | 20 | SEBC | HSB576 | 45 | 5 |
| Comparative Example 1 | 50 | EPM | EP07P | 50 | SEBS | H1041 | 30 | 30 |
| Comparative Example 2 | 80 | EPM | EP07P | 20 | SEBS | H1041 | 30 | 20 |
| Comparative Example 3 | 80 | EPM | EP07P | 20 | SEBS | H1041 | 30 | 10 |

TABLE 1-2

| Example and Comparative Example | Composition | | | | | | | |
|---|---|---|---|---|---|---|---|---|
| | C PPE | D Styrene-Olefin Copolymer with Low Styrene Content | | | | E Oil, Wax | | |
| | 0.55 dl/g, CHCl₃, 25° C. wt. pts. | Compound | Grade | Styrene Content wt. % | Amount Added wt. pts. | Compound | Grade | Amount Added wt. pts. |
| Example 1 | 0 | — | — | — | 0 | — | — | 0 |
| Example 2 | 0 | — | — | — | 0 | — | — | 0 |
| Example 3 | 0 | — | — | — | 0 | — | — | 0 |
| Example 4 | 0 | — | — | — | 0 | — | — | 0 |
| Example 5 | 4 | — | — | — | 0 | — | — | 0 |
| Exaple 6 | 4 | SEBS | Septon 8006 | 30 | 2 | — | — | 0 |
| Example 7 | 4 | SEBS | Septon 8006 | 30 | 10 | — | — | 0 |
| Example 8 | 4 | — | — | — | 0 | paraffin oil | PW380 | 2 |
| Example 9 | 4 | — | — | — | 0 | paraffin oil | PW380 | 10 |
| Example 10 | 4 | — | — | — | 0 | silicone oil | SH200 | 2 |
| Example 11 | 4 | — | — | — | 0 | silicone oil | SH200 | 10 |
| Example 12 | 4 | SEBS | Septon 8006 | 30 | 2 | paraffin oil | PW380 | 2 |
| Example 13 | 4 | SEBS | Septon 8006 | 30 | 2 | silicone oil | SH200 | 2 |
| Example 14 | 0 | — | — | — | 0 | — | — | 0 |
| Example 15 | 0 | — | — | — | 0 | — | — | 0 |
| Comparative Example 1 | 0 | — | — | — | 0 | — | — | 0 |
| Comparative Example 2 | 0 | — | — | — | 0 | — | — | 0 |
| Comparative Example 3 | 0 | — | — | — | 0 | — | — | 0 |

TABLE 1-3

| Example and Comparative Example | Composition | | | Physical Properties | | Peeling Resistance |
|---|---|---|---|---|---|---|
| | F Inorganic Filler GF Asahi Fiber's F1712 10 μm × 3 mm wt. pts. | G Polar Group-Containing Polymer Compound | Amount Added wt. pts. | Izod Impact Strength (with notches) According to JIS K-7110 kJ/m² | Tensile Elongation According to JIS K-7113 % | Resistance to Peeling of Surface Layer Visual Observation A: Very Good B: Good C: Not Good |
| Example 1 | 0 | — | 0 | 22.1 | 25.9 | A |
| Example 2 | 0 | — | 0 | 13.6 | 19.4 | A |
| Example 3 | 0 | — | 0 | 10.8 | 16.8 | A |
| Example 4 | 0 | — | 0 | 9.0 | 12.0 | A |
| Example 5 | 0 | — | 0 | 11.0 | 16.0 | A |
| Example 6 | 0 | — | 0 | 12.7 | 18.2 | A |
| Example 7 | 0 | — | 0 | 15.8 | 23.4 | A |
| Example 8 | 0 | — | 0 | 13.0 | 20.6 | A |
| Example 9 | 0 | — | 0 | 15.1 | 25.5 | A |
| Example 10 | 0 | — | 0 | 12.8 | 20.0 | A |
| Example 11 | 0 | — | 0 | 15.3 | 24.9 | A |
| Example 12 | 0 | — | 0 | 16.1 | 26.3 | A |
| Example 13 | 0 | — | 0 | 15.9 | 26.8 | A |
| Example 14 | 0 | — | 0 | 9.4 | 12.1 | A |
| Example 15 | 0 | — | 0 | 8.9 | 10.9 | B |
| Comparative Example 1 | 0 | — | 0 | 7.1 | 9.8 | C |
| Comparative Example 2 | 0 | — | 0 | 3.3 | 3.4 | C |
| Comparative Example 3 | 0 | — | 0 | 2.4 | 2.5 | C |

TABLE 1-4

| Example and Comparative Example | (a) of A SPS Product Obtained in Production Example 1 wt. pts. | (b) of A Polyolefin Compound | Grade | Amount Added wt. pts. | B Miscibility-Improving Agent Compound | Grade | Styrene Content wt. % | Amount Added wt. pts. |
|---|---|---|---|---|---|---|---|---|
| Comparative Example 4 | 80 | EPM | EP07P | 20 | SEBS | H1081 | 30 | 5 |
| Comparative Example 5 | 80 | EPM | EP07P | 20 | SEBS | H1041 | 30 | 5 |
| Comparative Example 6 | 80 | EPM | EP07P | 20 | SEPS | Septon 2002 | 30 | 5 |
| Example 16 | 50 | EPDM | EP181SP | 50 | SEBS | H1081 | 60 | 30 |
| Example 17 | 80 | EPDM | EP181SP | 20 | SEBS | H1081 | 60 | 20 |
| Example 18 | 80 | EPDM | EP181SP | 20 | SEBS | H1081 | 60 | 10 |
| Example 19 | 80 | EPDM | EP181SP | 20 | SEBS | H1081 | 60 | 5 |
| Example 20 | 80 | EPDM | EP181SP | 20 | SEBS | H1081 | 60 | 5 |
| Example 21 | 80 | EPDM | EP181SP | 20 | SEPS | Septon 2002 | 65 | 5 |
| Example 22 | 80 | EPDM | EP181SP | 20 | SEBC | HSB576 | 45 | 5 |
| Comparative Example 7 | 50 | EPDM | EP181SP | 50 | SEBS | H1041 | 30 | 30 |
| Comparative Example 8 | 80 | EPDM | EP181SP | 20 | SEBS | H1041 | 30 | 20 |
| Comparative Example 9 | 80 | EPDM | EP181SP | 20 | SEBS | H1041 | 30 | 10 |
| Comparative Example 10 | 80 | EPDM | EP181SP | 20 | SEBS | H1041 | 30 | 5 |
| Comparative Example 11 | 80 | EPDM | EP181SP | 20 | SEBS | H1041 | 30 | 5 |
| Comparative Example 12 | 80 | EPDM | EP181SP | 20 | SEPS | Septon 2002 | 30 | 5 |
| Example 23 | 50 | b-PP | E185G | 50 | SEBS | H1081 | 60 | 30 |
| Example 24 | 80 | b-PP | E185G | 20 | SEBS | H1081 | 60 | 20 |

TABLE 1-5

| Example and Comparative Example | C PPE 0.55 dl/g, CHCl$_3$, 25° C. wt. pts. | D Styrene-Olefin Copolymer with Low Styrene Content Compound | Grade | Styrene Content wt. % | Amount Added wt. pts. | E Oil, Wax Compound | Grade | Amount Added wt. pts. |
|---|---|---|---|---|---|---|---|---|
| Comparative Example 4 | 0 | — | — | — | 0 | — | — | 0 |
| Comparative Example 5 | 4 | — | — | — | 0 | — | — | 0 |
| Comparative Example 6 | 0 | — | — | — | 0 | — | — | 0 |
| Example 16 | 0 | — | — | — | 0 | — | — | 0 |
| Example 17 | 0 | — | — | — | 0 | — | — | 0 |
| Example 18 | 0 | — | — | — | 0 | — | — | 0 |
| Example 19 | 0 | — | — | — | 0 | — | — | 0 |
| Example 20 | 4 | — | — | — | 0 | — | — | 0 |
| Example 21 | 0 | — | — | — | 0 | — | — | 0 |
| Example 22 | 0 | — | — | — | 0 | — | — | 0 |
| Comparative Example 7 | 0 | — | — | — | 0 | — | — | 0 |
| Comparative Example 8 | 0 | — | — | — | 0 | — | — | 0 |
| Comparative Example 9 | 0 | — | — | — | 0 | — | — | 0 |
| Comparative Example 10 | 0 | — | — | — | 0 | — | — | 0 |
| Comparative Example 11 | 4 | — | — | — | 0 | — | — | 0 |
| Comparative Example 12 | 0 | — | — | — | 0 | — | — | 0 |
| Example 23 | 0 | — | — | — | 0 | — | — | 0 |
| Example 24 | 0 | — | — | — | 0 | — | — | 0 |

TABLE 1-6

| Example and Comparative Example | Composition F Inorganic Filler GF Asahi Fiber's F1712 10 μm × 3 mm wt. pts. | G Polar Group-Containing Polymer Compound | G Amount Added wt. pts. | Physical Properties Izod Impact Strength (with notches) According to JIS K-7110 kJ/m² | Physical Properties Tensile Elongation According to JIS K-7113 % | Peeling Resistance Resistance to Peeling of Surface Layer Visual Observation A: Very Good B: Good C: Not Good |
|---|---|---|---|---|---|---|
| Comparative Example 4 | 0 | — | 0 | 1.9 | 1.5 | C |
| Comparative Example 5 | 0 | — | 0 | 2.3 | 1.9 | C |
| Comparative Example 6 | 0 | — | 0 | 1.9 | 1.8 | C |
| Example 16 | 0 | — | 0 | 25.5 | 27.1 | A |
| Example 17 | 0 | — | 0 | 14.2 | 20.3 | A |
| Example 18 | 0 | — | 0 | 11.5 | 17.8 | A |
| Example 19 | 0 | — | 0 | 9.1 | 13.3 | A |
| Example 20 | 0 | — | 0 | 12.0 | 17.0 | A |
| Example 21 | 0 | — | 0 | 8.8 | 13.0 | A |
| Example 22 | 0 | — | 0 | 8.5 | 11.9 | B |
| Comparative Example 7 | 0 | — | 0 | 7.5 | 9.4 | C |
| Comparative Example 8 | 0 | — | 0 | 3.2 | 3.6 | C |
| Comparative Example 9 | 0 | — | 0 | 2.6 | 2.3 | C |
| Comparative Example 10 | 0 | — | 0 | 2.2 | 1.8 | C |
| Comparative Example 11 | 0 | — | 0 | 2.4 | 2.2 | C |
| Comparative Example 12 | 0 | — | 0 | 1.9 | 2.0 | C |
| Example 23 | 0 | — | 0 | 16.0 | 16.1 | A |
| Example 24 | 0 | — | 0 | 8.0 | 11.0 | A |

Notes:
SPS: Obtained in Production Example 1.
EP07P: EPR produced by Japan Synthetic Rubber Co., Ltd.
EP181SP: EPDM produced by Japan Synthetic Rubber Co., Ltd.
E-185G: b-PP produced by Idemitsu Petrochemical Co., Ltd.
L0134N: LLDPE produced by Idemitsu Petrochemical Co., Ltd.
Tuftec H1081: SEBS produced by Asahi Chemical Industry Co., Ltd.
Tuftec H1041: SEBS produced by Asahi Chemical Industry Co., Ltd.
Septon 2104: SEPS produced by Kuraray Co., Ltd.
Septon 2002: SEPS produced by Kuraray Co., Ltd.
Septon 8006: SEBS produced by Kuraray Co., Ltd.
Dynaron HBS576: SEBC produced by Japan Synthetic Rubber Co., Ltd.
PPE: Poly(2,6-dimethyl-1,4-phenylene ether) having an intrinsic viscosity of 0.55 dl/g in chloroform at 25° C.
PW 380: Paraffin oil produced by Idemitsu Kosan Co., Ltd.
SH 200: Silicone oil produced by Toray Dow Corning Silicone Co., Ltd.
FT 712: Glass fiber having a length of 3 mm and a diameter of 10 μm, produced by Asahi Fiber Glass Co., Ltd.

As has been described in detail hereinabove, the syndiotactic polystyrenic resin composition of the present invention can be formed into articles having good heat resistance, a high modulus of elasticity and greatly improved toughness. In addition, the articles are advantageous in that their surface layers are hardly peeled.

Therefore, the resin composition of the present invention is favorably used in forming various materials for industrial use, for example, electric and electronic materials (e.g., connectors, substrates for printed circuits), industrial construction materials, car parts (e.g., connectors to be mounted on cars, wheel caps, cylinder head covers), household appliances, various machine parts, pipes, sheets, trays, films, etc.

While the invention has been described in detail and with reference to specific embodiments thereof, it will be apparent to one skilled in the art that various changes and modifications can be made therein without departing from the spirit and scope thereof.

What is claimed is:
1. A syndiotactic polystyrenic resin composition, comprising: resin components of
 (A) 100 parts by weight of a component composed of
  (a) from 10 to 98% by weight of a styrene-based polymer having a syndiotactic configuration; and
  (b) from 2 to 90% by weight of a polyolefin,
 (B) from 0.5 to 50 parts by weight of a styrene-olefin copolymer having a styrene content of from 40 to 85% by weight, wherein said styrene-olefin copolymer (B) is a block copolymer or a graft copolymer;

(C) from 0.5 to 10.0 parts by weight, relative to 100 parts by weight of the component (a) of (A), of a polyphenylene ether, said polyphenylene ether having an intrinsic viscosity in chloroform at 25° C. of 0.4 dl/g or higher;

(D) from 0 to 200 parts by weight, relative to 100 parts by weight of the component (b) of (A), of a styrene-olefin copolymer having a styrene content of from 5 to 35% by weight; and (E) from 1 to 150 parts by weight, relative to 100 parts by weight of the component (b) of (A), of a silicone oil.

2. The composition of claim 1, wherein the component (D) comprises at least one member selected from the group consisting of a hydrogenated styrene-butadiene-styrene block copolymer, a hydrogenated styrene-isoprene-styrene block copolymer, a hydrogenated styrene-butadiene copolymer and a hydrogenated styrene-isoprene block copolymer.

3. The composition of claim 1, wherein (E) is present in an amount of from 5 to 100 parts by weight, relative to 100 parts by weight of the component (b) of (A).

4. The composition of claim 1, further comprising (F) from 0.5 to 350 parts by weight, relative to 100 parts by weight of the resin components, of an inorganic filler.

5. The composition of claim 1, further comprising from 0.1 to 10 parts by weight of (G) a polymer;

wherein said polymer is miscible with or has an affinity for the component (a) of (A);

wherein said polymer has a polar group and is selected from the group consisting of a polyphenylene ether modified with maleic acid or fumaric acid, a syndiotactic polystyrene modified with maleic acid or fumaric acid, and a mixture thereof; and wherein said 0.1 to 10 parts by weight of (G) are based on 100 parts by weight of the resin composition.

6. The composition of claim 1, wherein the component (B) comprises at least one member selected from the group consisting of a hydrogenated styrene-butadiene-styrene block copolymer, a hydrogenated styrene-isoprene-styrene block copolymer, a hydrogenated styrene-butadiene copolymer and a hydrogenated styrene-isoprene block copolymer.

7. The composition of claim 1, wherein component (b) of (A) comprises at least one member selected from the group consisting of an ethylene-propylene copolymer, an ethylene-propylene-diene copolymer, a polypropylene and a polyethylene.

8. The composition of claim 1, wherein (C) is present in an amount of from 1 to 5 parts by weight, relative to 100 parts by weight of the component (a) of (A).

9. The composition of claim 1, wherein (D) is present in an amount of from 1 to 150 parts by weight, relative to 100 parts by weight of the component (b) of (A).

10. The composition of claim 1, wherein (D) is present in an amount of from 5 to 150 parts by weight, relative to 100 parts by weight of the component (b) of (A).

* * * * *

UNITED STATES PATENT AND TRADEMARK OFFICE
CERTIFICATE OF CORRECTION

PATENT NO. : 6,469,081 B1  Page 1 of 1
DATED : October 22, 2002
INVENTOR(S) : Chino et al.

It is certified that error appears in the above-identified patent and that said Letters Patent is hereby corrected as shown below:

<u>Title page,</u>
Item [30], Foreign Application Priority Data, should read:
-- [30]     Foreign  Application Priority Data
   Sep. 8, 1995  (JP) ................................... 7-230978 --

Signed and Sealed this

Eighteenth Day of February, 2003

JAMES E. ROGAN
*Director of the United States Patent and Trademark Office*